(12) United States Patent
Chen et al.

(10) Patent No.: US 7,837,841 B2
(45) Date of Patent: Nov. 23, 2010

(54) APPARATUSES FOR ELECTROCHEMICAL DEPOSITION, CONDUCTIVE LAYER, AND FABRICATION METHODS THEREOF

(75) Inventors: Kei-Wei Chen, Taipei County (TW); Mu-Han Cheng, Tainan County (TW); Jian-Sin Tsai, Tainan (TW); Ying-Lang Wang, Taichung County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 483 days.

(21) Appl. No.: 11/686,504

(22) Filed: Mar. 15, 2007

(65) Prior Publication Data
US 2008/0223724 A1 Sep. 18, 2008

(51) Int. Cl.
C25D 5/00 (2006.01)
C25D 5/18 (2006.01)
C25D 17/00 (2006.01)
C25B 15/00 (2006.01)

(52) U.S. Cl. .................. 204/232; 204/227; 205/96; 205/103; 205/104; 205/105; 205/102

(58) Field of Classification Search .................. 204/227, 204/232; 205/96, 102–105; 428/44
See application file for complete search history.

(56) References Cited
U.S. PATENT DOCUMENTS

| 6,140,241 | A | 10/2000 | Shue et al. |
| 6,179,983 | B1 | 1/2001 | Reid et al. |
| 6,224,737 | B1 | 5/2001 | Tsai et al. |
| 6,228,233 | B1 * | 5/2001 | Lakshmikanthan et al. . 204/277 |
| 6,261,433 | B1 * | 7/2001 | Landau ........................ 205/96 |
| 6,270,647 | B1 * | 8/2001 | Graham et al. ................ 205/99 |
| 6,350,362 | B1 * | 2/2002 | Geisler et al. ............... 205/101 |
| 6,402,923 | B1 | 6/2002 | Mayer et al. |
| 6,562,204 | B1 | 5/2003 | Mayer et al. |

FOREIGN PATENT DOCUMENTS

| CN | 1685086 | 10/2005 |
| JP | 62103392 A | 5/1987 |

OTHER PUBLICATIONS

English Language abstract of JP 62-103392, published May 13, 2987.
Chinese language office action dated Sep. 9, 2010.
English language translation of abstract CN 1685086 (published Oct. 19, 2005).

* cited by examiner

*Primary Examiner*—Nam X Nguyen
*Assistant Examiner*—Susan Thai
(74) *Attorney, Agent, or Firm*—Thomas, Kayden, Horstemeyer & Risley

(57) ABSTRACT

Electrochemical plating (ECP) apparatuses with auxiliary cathodes to create uniform electric flux density. An ECP apparatus for electrochemical deposition includes an electrochemical cell with an electrolyte bath for electrochemically depositing a metal on a substrate. A main cathode and an anode are disposed in the electrolyte bath to provide a main electrical field. A substrate holder assembly holds a semiconductor wafer connecting the cathode. An auxiliary cathode is disposed outside the electrochemical cell to provide an auxiliary electrical field such that a flux line density at the center region of the substrate holder assembly substantially equals that at the circumference of the substrate holder assembly.

9 Claims, 11 Drawing Sheets

APPARATUSES FOR ELECTROCHEMICAL DEPOSITION, CONDUCTIVE LAYER, AND FABRICATION METHODS THEREOF

BACKGROUND OF THE INVENTION

1. Field of the Invention

The invention relates to an apparatus and method for fabricating a metal layer on a substrate, and more particularly, to an apparatus for electrochemical deposition with auxiliary cathode, conductive layer on a semiconductor wafer and a fabrication method for the same.

2. Description of the Related Art

Conductive interconnections on integrated circuits conventionally take the form of trenches and vias. In deep submicron integrated circuits, the trenches and vias are typically formed by a damascene or dual damascene process. Copper is currently used in ultra large scale integration (ULSI) metallization as a replacement for aluminum due to lower resistivity and better electromigration resistance. Electrochemical copper deposition (ECD) has been adopted as the standard damascene or dual damascene process because of larger grain size (good electromigration) and higher deposition rates. More particularly, electroplating is well suited for the formation of small embedded damascene feature metallization due to its ability to readily control growth of the electroplated film for bottom-up filling, and the superior electrical conductivity characteristics of the electroplated film.

FIG. 1 shows a conventional electrochemical plating process apparatus 100, with a wafer 2 mounted therein. Apparatus 100 includes a substrate holder assembly 3 mounted on a rotatable spindle 5. During the electrochemical plating cycle, semiconductor wafer 2 is mounted on the substrate holder assembly 3, which is then placed in a plating bath 22 containing a plating solution. As indicated by arrow 13, the plating solution is continually applied by a pump 40, flowing upwards to the center of the wafer and then radically outward and across wafer 2, as indicated by arrows 14. The plating solution then overflows from plating bath 22 to an overflow reservoir 20 as indicated by arrows 10 and 11. The plating solution is then filtered (not shown) and returned to pump 40 as indicated by arrow 12, completing recirculation. A DC power supply 50 has a negative output lead electrically connected to wafer 2. The positive output lead of power supply 50 is electrically connected to an anode 1 located in plating bath 22. During use, power supply 50 biases wafer 2 to provide a negative potential relative to anode 1 generating electrical current from the anode 1 to wafer 2.

FIG. 2 is a schematic view of an electric flux line between the anode and cathode of the conventional electrochemical plating process apparatus. In FIG. 2, a semiconductor wafer 2 is mounted on the substrate holder assembly 3. A contact ring 25 electrically connects the semiconductor wafer 2 through contact pins 25a. When an electrical field is biased between the anode 1 and the semiconductor wafer (cathode) 2, a plurality of field lines $F_c$ and $F_e$ show potential drop between the anode and cathode. Since the contact ring 25 electrically connects the semiconductor wafer 2 through contact pins 25a, sharper potential drop occurs at the circumference of the semiconductor such that the flux density $F_e$ adjacent to the contact pins is more focused than the flux density $F_c$ at the center region of cathode. The higher flux density $F_e$ adjacent to the contact pins results in higher current density as well as thicker deposition, thereby inducing peeling and particle sources due to edge residue. Uneven thickness can also exacerbate abnormal process performance and high resistance deviation performance.

Moreover, even though the film is planarized by CMP, copper residue can still be found on the wafer edge. Therefore, it is important that the electroplating surface is uniform and reliable to ensure edge residue free deposition.

However, it remains difficult to eliminate all edge residue and uneven plating thickness during ECD.

BRIEF SUMMARY OF THE INVENTION

The invention overcomes the shortcomings associated with and achieves other advantages not realized by conventional methods by providing an ECP apparatus with an auxiliary cathode to create uniform electric flux density both at the center region and circumference of the wafer, thereby improving process performance and device reliability.

The invention provides an apparatus for electrochemical deposition, comprising an electrochemical cell with an electrolyte bath for electrochemically depositing a metal on a substrate. A main cathode and an anode are disposed in the electrolyte bath to provide a main electrical field. A substrate holder assembly holds a semiconductor wafer connecting the cathode. An auxiliary cathode is disposed outside the electrochemical cell to provide an auxiliary electrical field such that a flux line density at the center region of the substrate holder assembly substantially equals that at the circumference of the substrate holder assembly.

The invention also provides a conductive layer on a semiconductor wafer, comprising a semiconductor wafer with a seed layer over features and a conductive layer electrochemically deposited on the semiconductor wafer by the ECP apparatus with an auxiliary cathode disposed outside the electrochemical cell to provide an auxiliary electrical field such that a flux line density at the center region of the substrate holder assembly substantially equals that at the circumference of the substrate holder assembly. A deviation of mean grain size of the conductive layer between the center region and the circumference of the semiconductor wafer is less than about 3-5%. A deviation of thickness of the conductive layer between the center region and the circumference of the semiconductor wafer is less than about 3-5%.

The invention further provides a method of fabricating a conductive layer on a semiconductor wafer. A semiconductor wafer with a seed layer over features is provided. A conductive layer is electrochemically deposited on the semiconductor wafer by the ECP apparatus with an auxiliary cathode disposed outside the electrochemical cell to provide an auxiliary electrical field such that a flux line density at the center region of the substrate holder assembly substantially equals that at the circumference of the substrate holder assembly. A deviation of mean grain size of the conductive layer between the center region and the circumference of the semiconductor wafer is less than about 3-5%. Electrochemical deposition of a conductive layer is performed by providing a first multiple step function current between the anode and the main cathode and a second multiple step function current between the anode and the auxiliary cathode.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
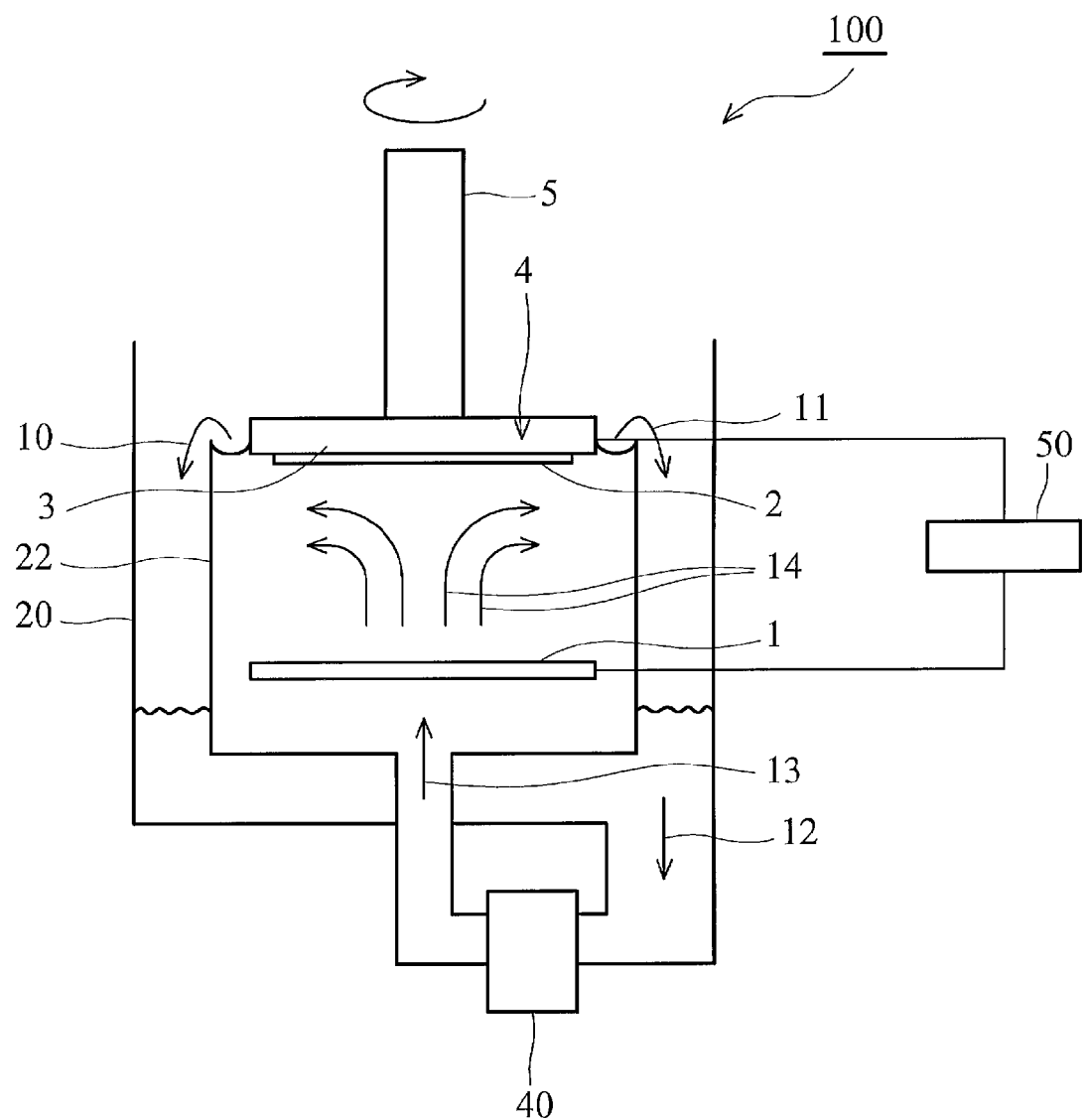
FIG. 1 shows a conventional electrochemical plating process apparatus, with a wafer mounted therein.
Figure 2:
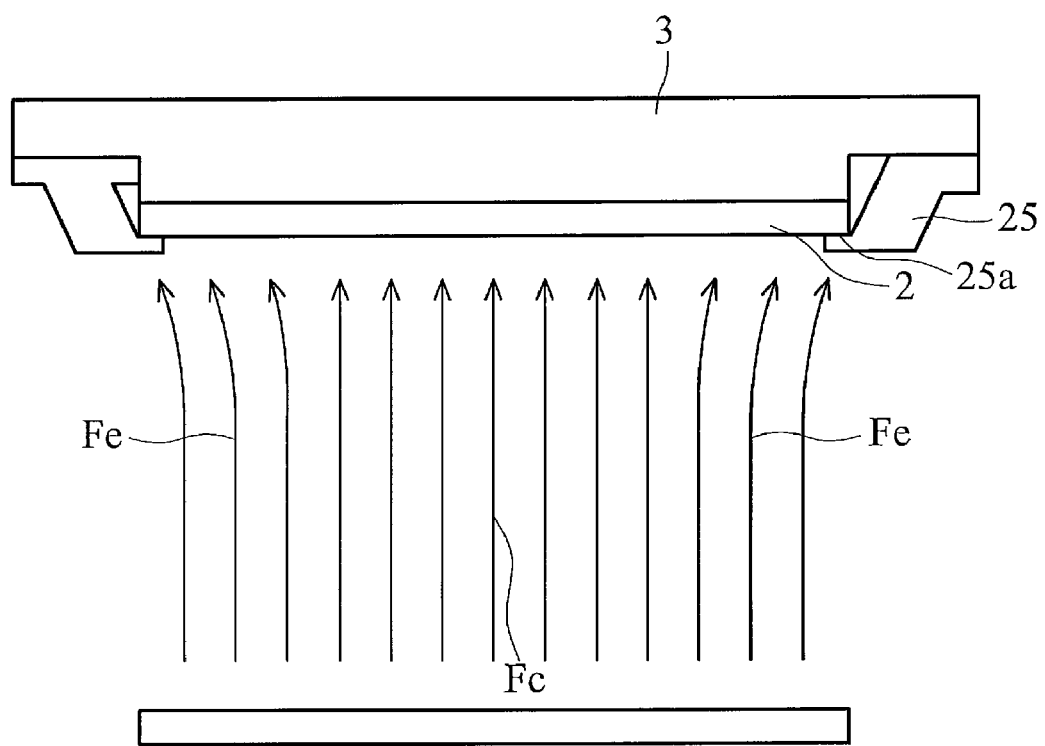
FIG. 2 is a schematic view of an electric flux line between the anode and cathode of the conventional electrochemical plating process apparatus.
Figure 3:
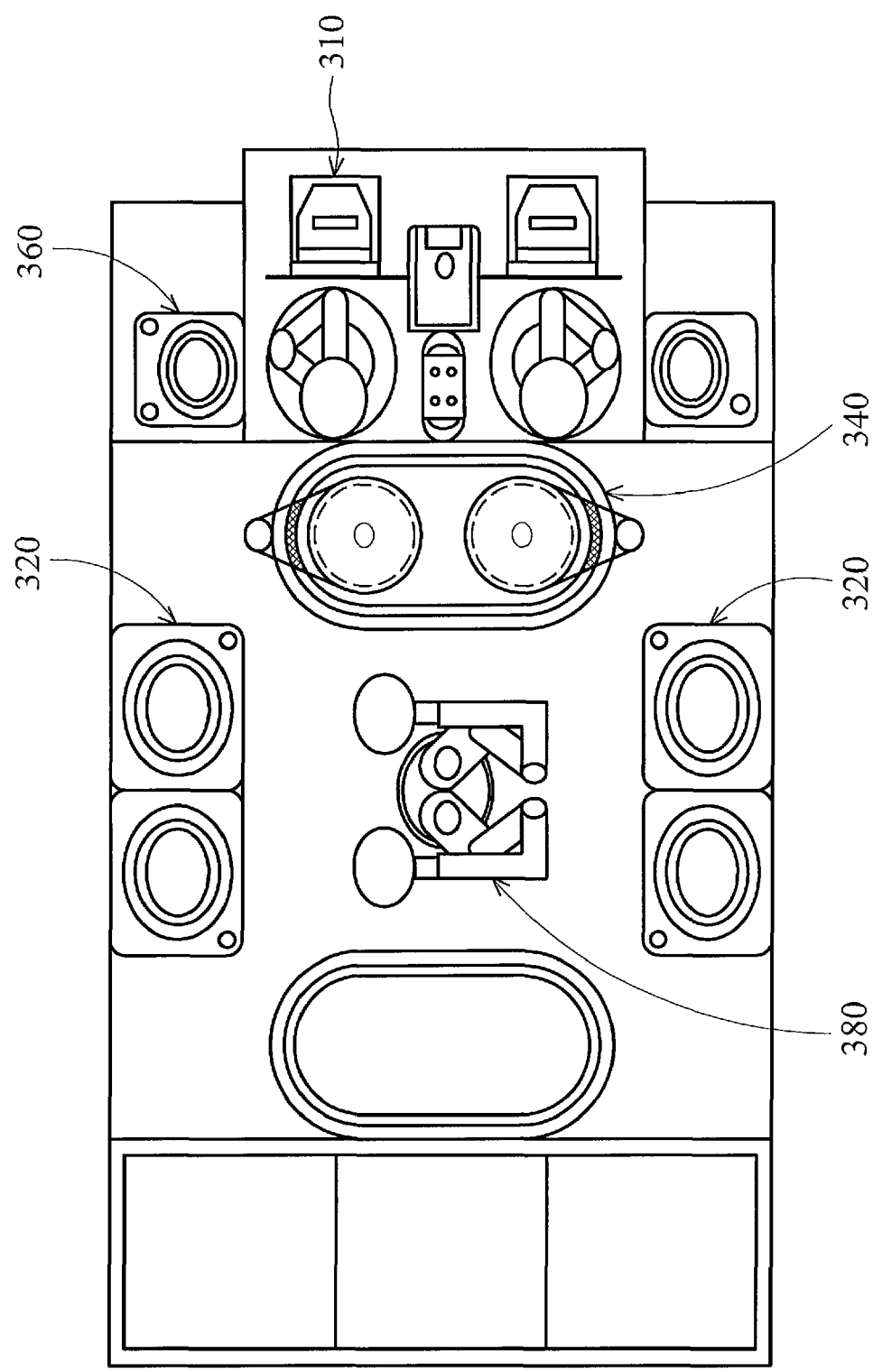
FIG. 3 is an upper plan view of an exemplarily embodiment of the ECD system 300 of the invention.

FIG. 3 is an upper plan view of an exemplarily embodiment of the ECD system 300 of the invention. Referring to FIG. 3, the ECD system 300 includes a loadlock station 310, a rapid thermal annealing (RTA) chamber 360, spin-rinse-dry (SRD) and edge bevel removal (EBR) chambers 340, a dual blade robot 380, and one or more electrochemical plating process cells 320. An electrolyte solution system (not shown) is positioned adjacent to the ECD system 300 and is individually connected to the process cells 320 to circulate electrolyte solution for the electroplating process. The ECD system 300 also includes a controller having a programmable microprocessor. A semiconductor substrate can be electroplated in the electrochemical plating process cells 320 and edge bevel removal (EBR) chambers 340.

Figure 4:
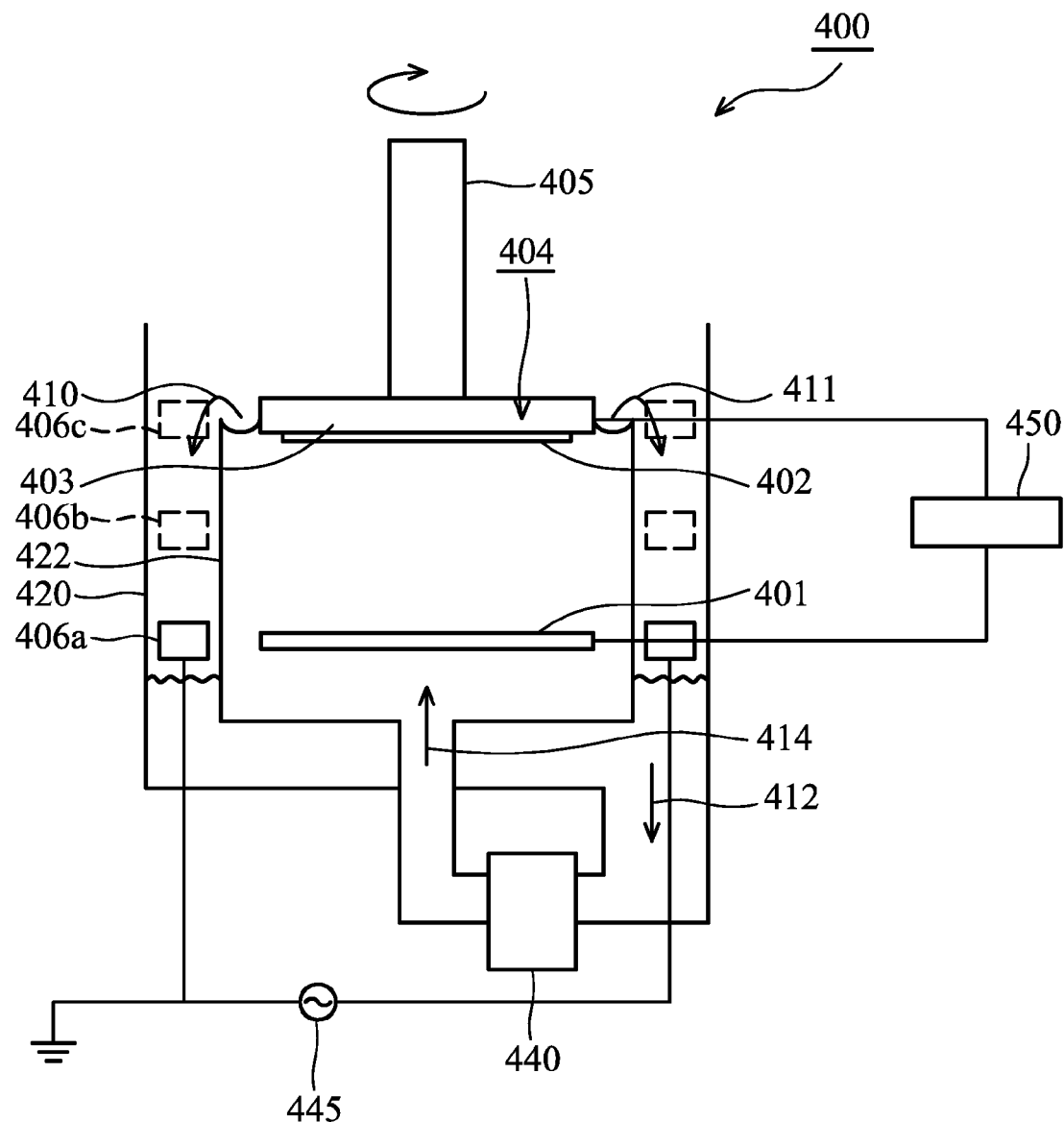
FIG. 4 shows an exemplary embodiment of the electrochemical plating (ECP) apparatus with auxiliary cathodes of the invention.

FIG. 4 shows an exemplary embodiment of the electrochemical plating (ECP) apparatus with auxiliary cathodes of the invention. The auxiliary cathodes are disposed outside the electrochemical cell to provide an auxiliary electrical field such that a flux line density at the center region of the substrate holder assembly substantially equals that at the circumference of the substrate holder assembly. FIG. 4 shows the ECP apparatus 400, with a wafer 402 mounted therein in accordance with an embodiment of the invention. Apparatus 400 includes a substrate holder assembly 403 mounted on a rotatable spindle 405. Although the invention is described using a simplified electrochemical plating apparatus, those skilled in the art will appreciate that other electrochemical plating apparatuses are equally suitable to achieve the desired processing results.

During the electrochemical plating cycle, wafer 402 is mounted in the substrate holder assembly 403, which is then placed in a plating bath 422 containing a plating solution. As indicated by arrow 414, the plating solution is continually applied by a pump 440. Generally, the plating solution flows upwards to the center of wafer 402 and then radically outward and across wafer 402. The plating solution then overflows from plating bath 422 to an overflow reservoir 420 as indicated by arrows 410 and 411. The plating solution is then filtered (not shown) and returned to pump 440 as indicated by arrow 412, completing recirculation.

Figure 5A:
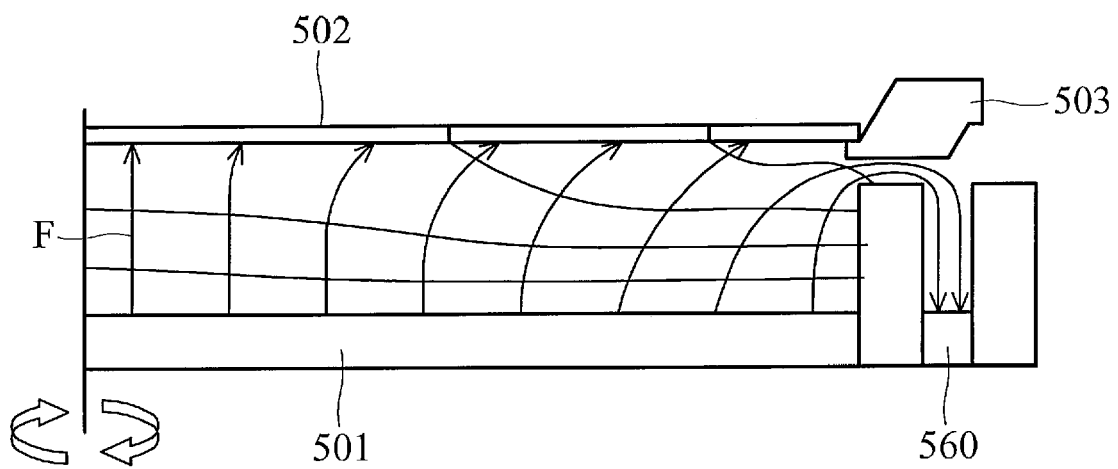
FIG. 5A is a schematic view of an exemplary configuration of the anode, main cathode and the auxiliary cathodes of the invention.
Figure 5B:
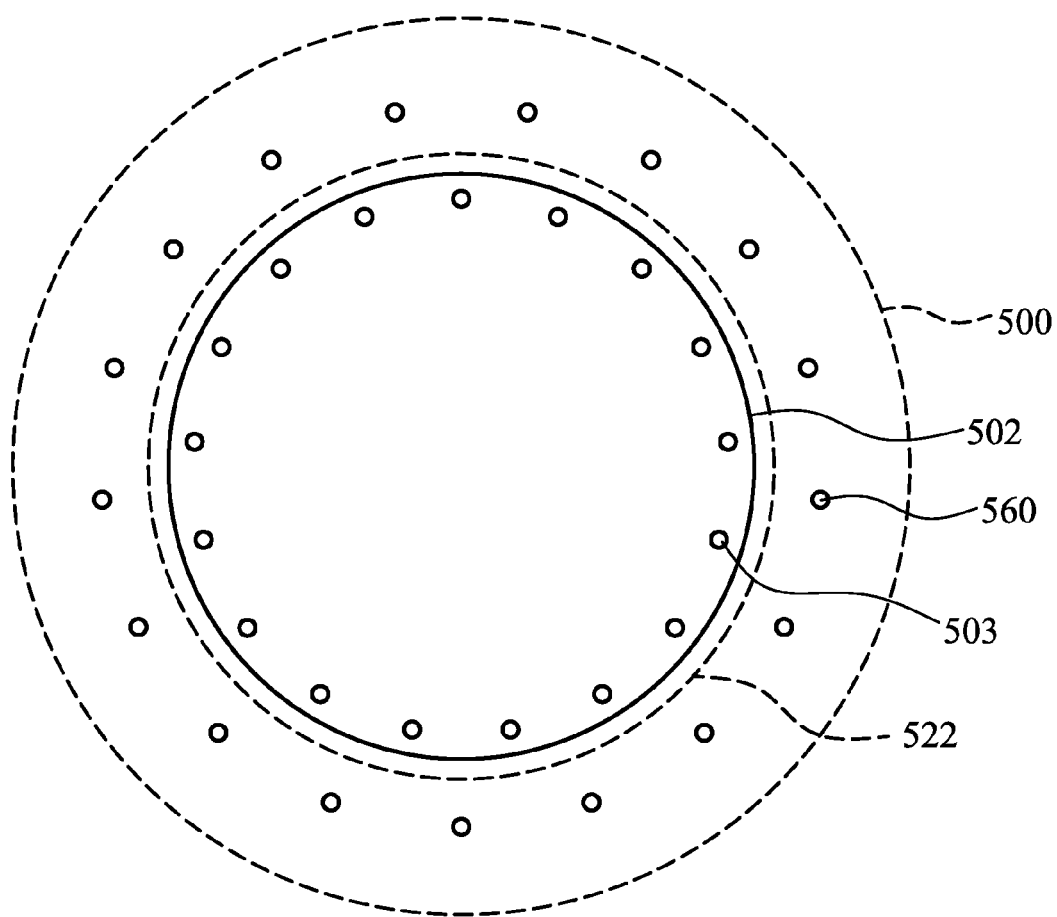
FIG. 5B is an upper plan view of an exemplary configuration of the cathode contact pins and the auxiliary cathode of the invention.

A first power supply such as DC power supply 450 providing a first multiple step function current has a negative output lead electrically connected to wafer 402 through one or more slip rings, brushes, or contact pins (shown in FIGS. 5A and 5B). The positive output lead of power supply 450 is electrically connected to an anode 401 located in plating bath 422. Auxiliary cathodes 406a disposed outside the electrochemical cell 422 provide an auxiliary electrical field such that a flux line density at the center region of the substrate holder assembly substantially equals that at the circumference of the substrate holder assembly. According to a preferred embodiment of the invention, the auxiliary cathodes 460a are level with the anode 401. The auxiliary cathodes 460c can alternatively be level with the main cathode 402 or disposed between the anode 401 and the main cathode 402 as indicated by reference 406b. The auxiliary cathode 406a preferably comprises Cu with purity exceeding 99% or stainless steel. A second power supply 445 is configured between the anode 401 and the auxiliary cathodes 406a. During operation, power supply 450 biases wafer 402 to provide a negative potential relative to anode 401 generating electrical current from the anode 401 to wafer 402. Since the auxiliary cathodes provide an auxiliary electrical field such that a flux line density at the center region of the substrate holder assembly substantially equals that at the circumference of the substrate holder assembly, residue-free electro-deposition and uniformity control improvement can be achieved.

FIG. 5A is schematic view of an exemplary configuration of the anode, main cathode and the auxiliary cathodes of the invention. In FIG. 5A, an anode 501 and a main cathode 502 are oppositely disposed. An auxiliary cathode 560 is disposed outside the plating cell. A main electrical field is formed between the main cathode 502 and an anode 501. An auxiliary electrical field is formed by the auxiliary cathodes 560 Therefore, the flux line density at the center region of the main cathode (wafer) is substantially equal to that at the circumference of the main cathode (wafer).

FIG. 5B is an upper plan view of an exemplary configuration of the cathode contact pins and the auxiliary cathode of the invention. In FIG. 5B, the ECP apparatus 500 includes the contact cathode pins 503 electrically connecting the circumference of the main cathode 502. The auxiliary cathodes 560 are disposed outside the plating cell 522 and staggering to adjacent contact pins 503. The staggered contact pins and auxiliary cathodes can even the electric field lines at the circumference of the main cathode (wafer).

In the following description, electrical current flows in the same direction as the net positive ion flux and opposite to the net electron flux. This causes an electrochemical reaction (e.g. $Cu^{2+}+2e^-=Cu$) on wafer 402 which results in deposition of the electrically conductive layer (e.g. copper) thereon. The ion concentration of the plating solution is replenished during the plating cycle, e.g., by dissolution of a metallic anode (e.g. $Cu=Cu^{2+}+2e^-$).

A typical electroplating solution contains electrolyte, such as $CuSO_4 Cu^{2+}$, $Cl^-$, $SO_4^{2-}$ and combinations thereof, suppressors, and other additives. The suppressor is a long chain polymer comprising polyether polymers, polyethylene glycol (PEG), or polyoxyethylene-polyoxypropylene copolymer (EO-PO).

Figure 6:
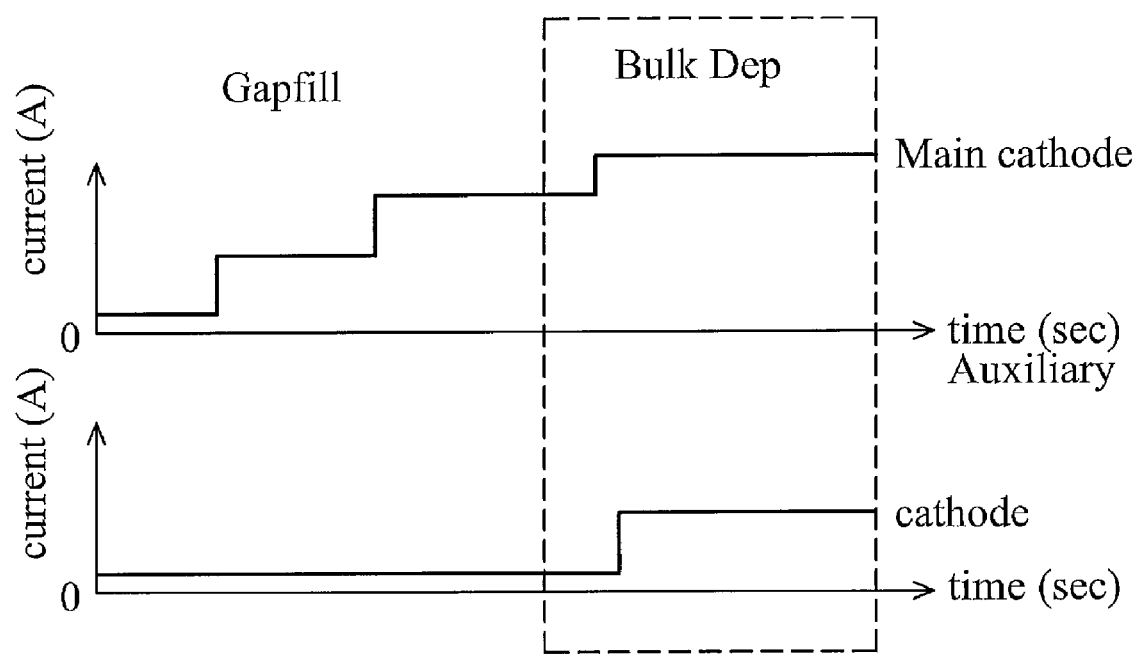
FIG. 6 shows a relationship between the current and the main cathode compared with a relationship between the current and the auxiliary cathode at different stages of electroplating.

FIG. 6 shows a relationship between the current and the main cathode compared with that between the current and the auxiliary cathode at different stages of electroplating. The first power supply provides a first multiple step function current on the main cathode, and the second power supply provides a second multiple step function current on the auxiliary cathode respectively. More preferably, the first multiple step function current is different from the second multiple step function current, as shown in FIG. 6. When a conductive layer is deposited on a semiconductor wafer with features thereon, the electric current of the first multiple step function current is discretely increased at initial gap-fill stage and steadily at the bulk deposition stage. The electric current of the second multiple step function current is merely performed at the bulk deposition stage.

Figure 7:
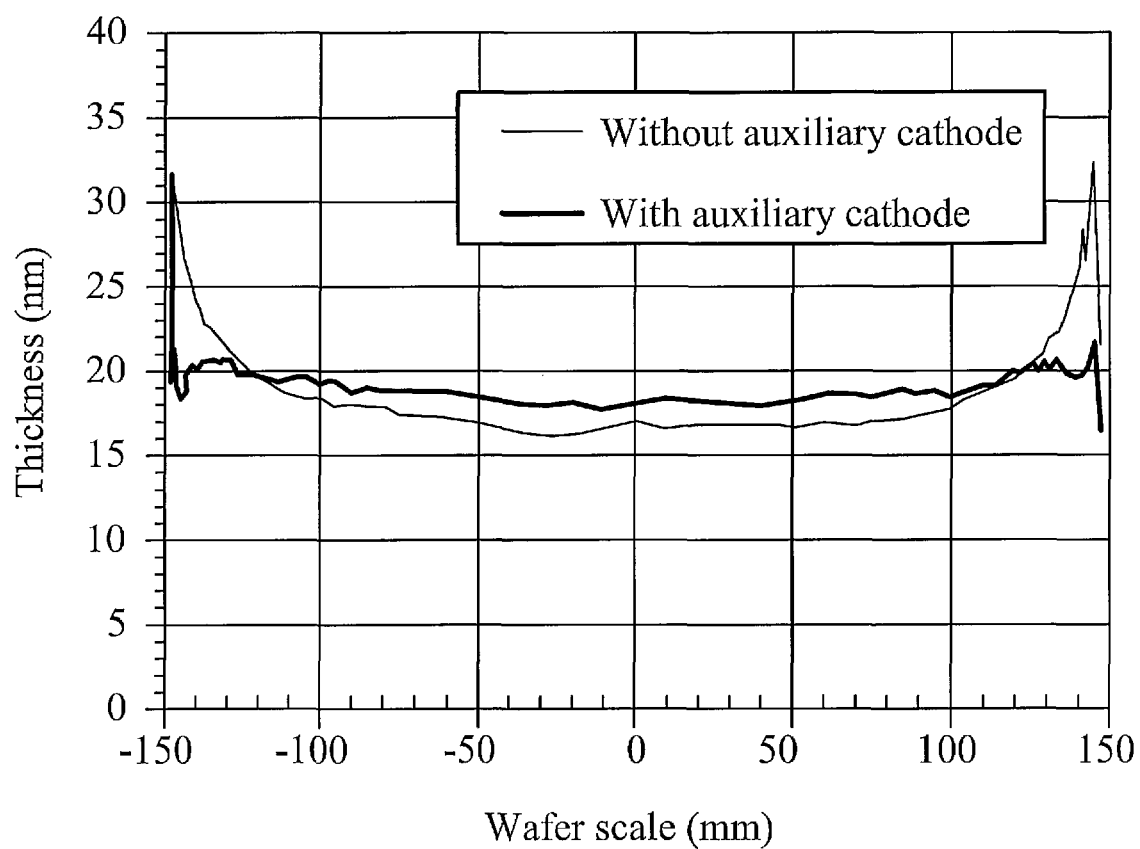
FIG. 7 is a graph illustrating a comparison of electrodeposition with and without auxiliary cathodes.
Figure 8A:
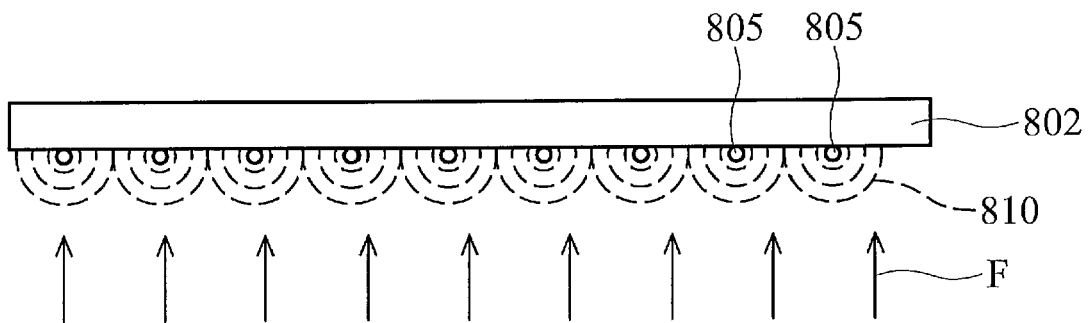
FIGS. 8A-8B are schematic views of side-by-side comparisons illustrating nuclei created and growth on the wafer of electro-deposition by a preferred embodiment and conventional apparatus respectively.
Figure 8B:
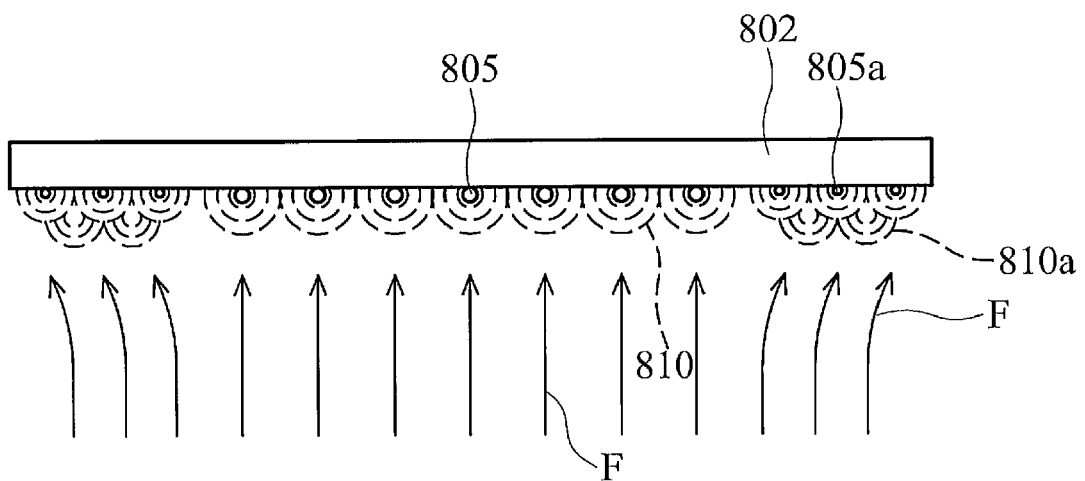

FIG. 7 is a graph illustrating comparison between electro-deposition with and without auxiliary cathodes. The auxiliary cathodes can prevent edge residue and improve film uniformity. Referring to FIG. 8A, the auxiliary cathodes can also result in even electric flux lines and current density. More uniform nuclei 805 which develop uniform grain size distribution are created on the wafer 805, thereby improving reliability and preventing electro-migration (EM). Deviation of mean grain size of the conductive layer between the center region and the circumference of the semiconductor wafer is less than about 3-5%. By comparison with conventional ECP apparatus without auxiliary cathode, conventional electro-deposition creates denser nuclei which develop smaller grain size at circumference of the wafer, as shown in FIG. 8B.

FIGS. 9A-9D are cross sections of an exemplary fabrication method of dual damascene interconnect structure during various stages of the fabrication process. Generally, the method comprises physical vapor deposition of a barrier layer over the feature surfaces, and a conductive metal seed layer, preferably copper, over the barrier layer, followed by electroplating a conductive metal, preferably copper, over the seed layer to fill the interconnect structure/feature. Finally, the deposited layers and the dielectric layers are planarized, e.g., by chemical mechanical polishing (CMP), to define a conductive interconnect feature.

Figure 9A:
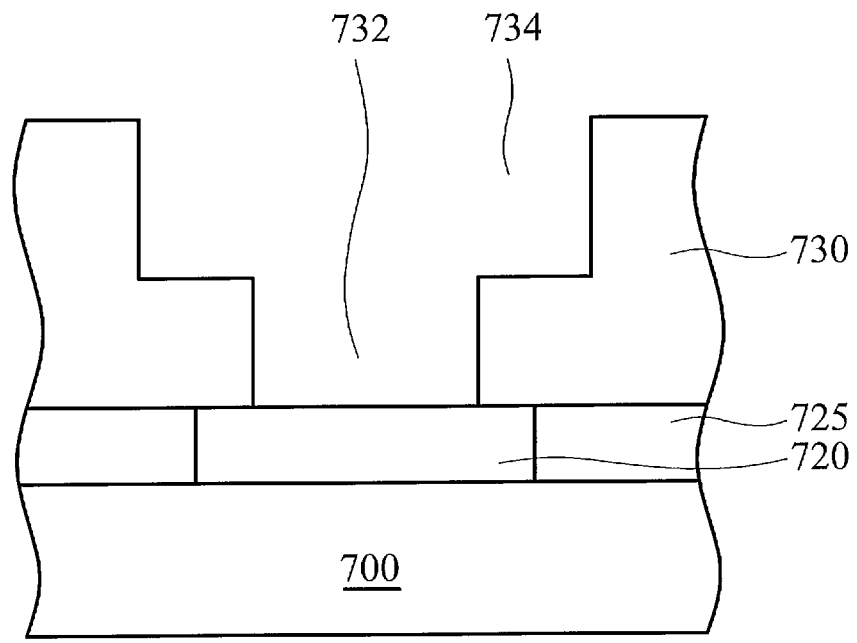
FIGS. 9A-9D are cross sections of an exemplary fabrication method of dual damascene interconnect structure during various stages of the fabrication process.

Referring to FIG. 9A, a semiconductor substrate 700 is provided. A copper metal interconnect 720 is shown patterned within an insulating layer 725, such as silicon oxide. In addition, a dielectric layer 730 is deposited and patterned with a via portion 732 and a trench portion 734. The dual damascene structure is thus formed comprising a via portion 732 and a trench portion 734.

Figure 9B:
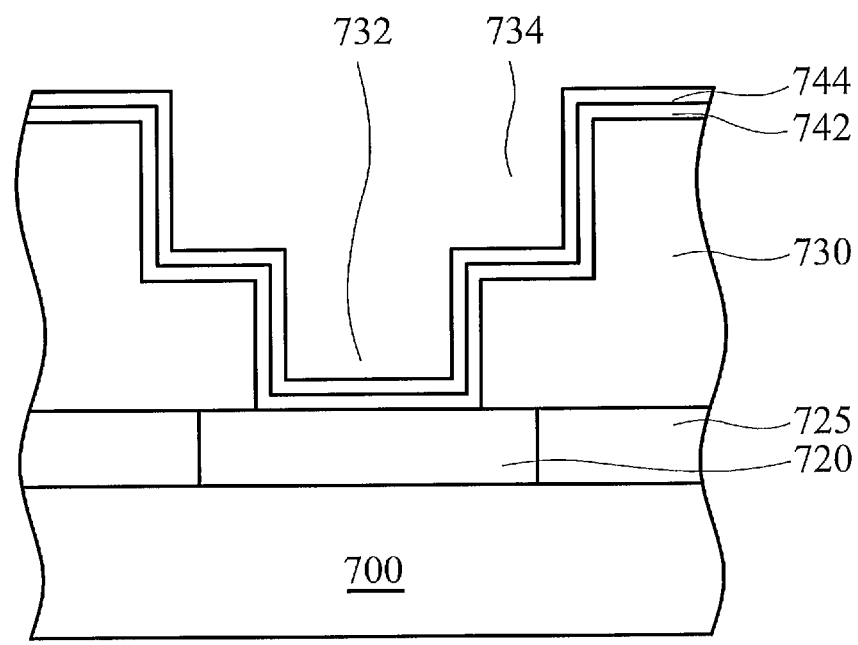

Referring to FIG. 9B, a barrier layer 742, preferably comprising tantalum (Ta) or tantalum nitride (TaN), is deposited over the surface of the dielectric 730, including the surfaces of the via portion 732 and the trench portion 734. The barrier layer 742 is typically deposited using physical vapor deposition (PVD) by sputtering or reactive PVD. The barrier layer 742 limits the diffusion of copper into the semiconductor substrate and the dielectric layer, thereby dramatically increasing reliability. For a high conductance barrier layer comprising tantalum, the barrier layer is preferably deposited by low temperature (<350° C.) PVD and then annealed at between about 350° C. and 600° C., or deposited by PVD at between about 350° C. and 600° C. Preferably, a barrier layer has a film thickness between about 250 Å and 500 Å for an interconnect structure/feature having sub-micron opening width. It is preferred that the barrier layer has a thickness between about 500 Å and about 3000 Å. A copper seed layer 744 is deposited over the barrier layer 34 using PVD. The copper seed layer 744 provides good adhesion for subsequently electroplated copper. It is preferred that the seed layer has a thickness between about 500 Å and 3000 Å.

Figure 9C:
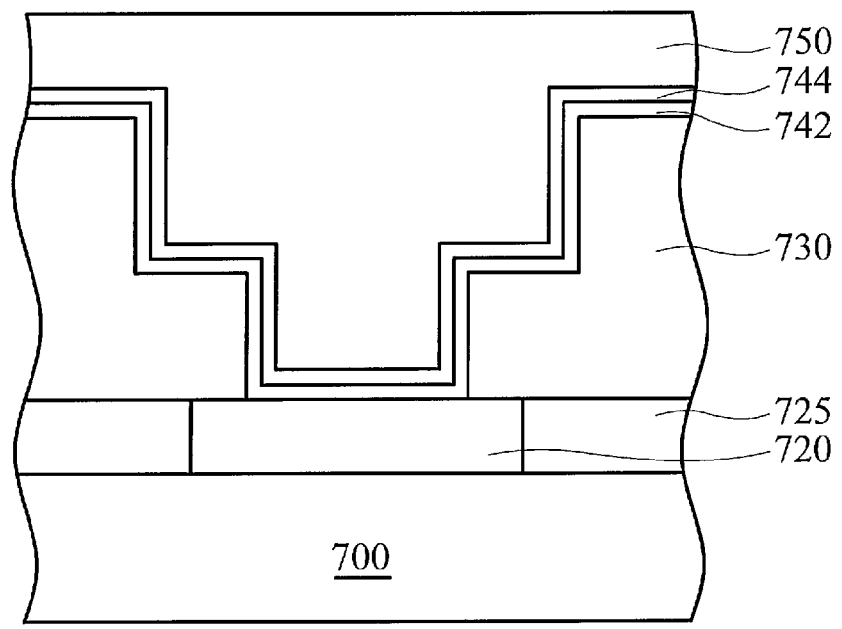

Referring to FIG. 9C, a conductive layer such as a copper layer 750 is electroplated over the copper seed layer 744 to metallize the dual damascene structure. The conductive layer electrochemically deposited by the ECP apparatus 400 with auxiliary cathodes as shown in FIG. 4. The ECP process is performed by a deposition current in a range between about 0.1 and 100 mA/cm$^2$, and at a deposition temperature in a range between about 0 and 50° C. During electro-deposition, first and a second multiple step function currents are provided by first and second power supplies to eliminate edge residue and improve film unification. The first multiple step function current is preferably different from the second multiple step function current. In a preferred embodiment of the invention, the thickness of the conductive layer exceeds 50 Å. An average grain size distribution of the conductive film is approximately 0.2 μm. The deviation of thickness of the conductive layer between the center region and the circumference of the semiconductor wafer is less than about 3-5%.

Figure 9D:
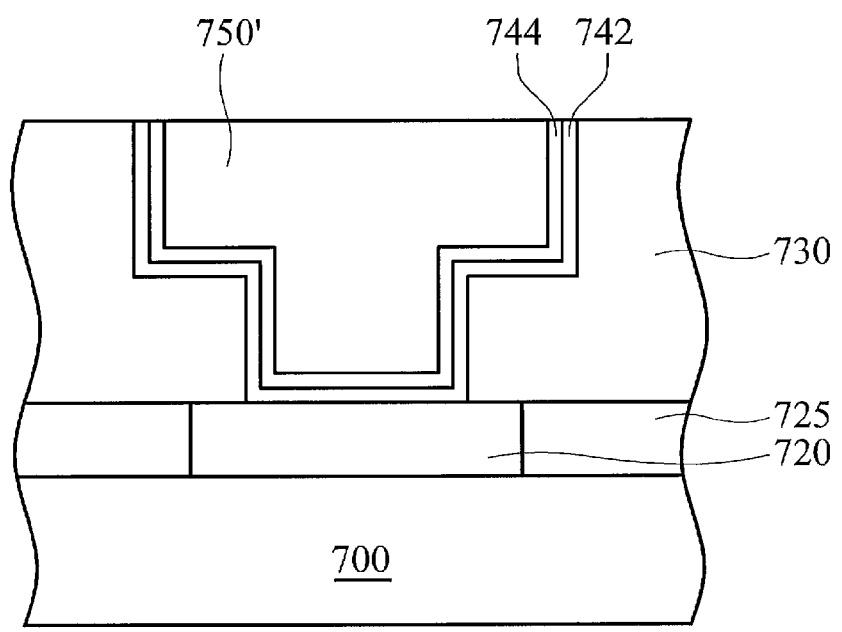

Referring to FIG. 9D, the top portion of the processed substrate, i.e., the exposed electroplated copper layer 750 (shown in FIG. 9C), is then planarized, preferably by chemical mechanical polishing (CMP). During planarization, portions of the copper layer 950, copper seed layer 944, barrier layer 942, and a top surface of the dielectric layer 930 are removed from the top surface of the substrate, leaving a fully planar surface with conductive interconnect features, such as a dual damascene structure.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for electrochemical deposition, comprising:
    an electrochemical cell with an electrolyte bath for electrochemically depositing a metal on a substrate;
    a main cathode and an anode disposed in the electrolyte bath to provide a main electrical field;
    contact cathode pins electrically connecting the circumference of the main cathode;
    a substrate holder assembly holding a semiconductor wafer connecting the cathode; and
    auxiliary cathodes disposed outside the electrochemical cell and being disposed in a staggered relationship with adjacent contact cathode pins to provide an auxiliary electrical field such that a flux line density at the center region of the substrate holder assembly substantially equals that at the circumference of the substrate holder assembly.

2. The apparatus for electrochemical deposition according to claim 1, wherein each auxiliary cathode is level with the anode.

3. The apparatus for electrochemical deposition according to claim 1, wherein each auxiliary cathode is level with the main cathode.

4. The apparatus for electrochemical deposition according to claim 1, wherein each auxiliary cathode is disposed between the anode and the main cathode.

5. The apparatus for electrochemical deposition according to claim 1, wherein each auxiliary cathode comprises Cu or stainless steel.

6. The apparatus for electrochemical deposition according to claim 1, wherein the electrolyte bath comprises $Cu^{2+}$, $Cl^-$, $SO_4^{2-}$ or combinations thereof.

7. The apparatus for electrochemical deposition according to claim 1, further comprising a first power supply electrically configured between the anode and the main cathode, and a second power supply configured between the anode and the auxiliary cathodes.

8. The apparatus for electrochemical deposition according to claim 7, wherein the first power supply provides a first multiple step function current, and the second power supply provides a second multiple step function current.

9. The apparatus for electrochemical deposition according to claim 8, wherein the first multiple step function current is different from the second multiple step function current.

* * * * *